(12) United States Patent
Wang et al.

(10) Patent No.: US 10,429,681 B1
(45) Date of Patent: Oct. 1, 2019

(54) STRUCTURE OF GOA CIRCUIT

(71) Applicant: Shenzhen China Star Optoelectronics Technology Co., Ltd., Shenzhen (CN)

(72) Inventors: Gang Wang, Shenzhen (CN); Lixuan Chen, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/427,284

(22) Filed: May 30, 2019

Related U.S. Application Data

(62) Division of application No. 15/503,707, filed on Feb. 13, 2017, now Pat. No. 10,359,656.

(30) Foreign Application Priority Data

Dec. 20, 2016 (CN) .......................... 2016 1 1184559

(51) Int. Cl.
| | |
|---|---|
| *H01L 21/00* | (2006.01) |
| *G02F 1/1333* | (2006.01) |
| *H01L 27/12* | (2006.01) |
| *G02F 1/1345* | (2006.01) |
| *G02F 1/1362* | (2006.01) |
| *H01L 29/423* | (2006.01) |
| *G09G 3/36* | (2006.01) |
| *H01L 29/417* | (2006.01) |

(52) U.S. Cl.
CPC .... *G02F 1/133305* (2013.01); *G02F 1/13454* (2013.01); *G02F 1/136227* (2013.01); *G02F 1/136286* (2013.01); *G09G 3/3648* (2013.01); *H01L 27/124* (2013.01); *H01L 27/1218* (2013.01); *H01L 29/41733* (2013.01); *H01L 29/42384* (2013.01); *G02F 2201/42* (2013.01); *G09G 2300/043* (2013.01); *G09G 2300/0408* (2013.01)

(58) Field of Classification Search
CPC ......... G02F 1/133305; H01L 29/41733; H01L 27/124
See application file for complete search history.

(56) References Cited

U.S. PATENT DOCUMENTS

| | | | | |
|---|---|---|---|---|
| 9,568,800 | B1 * | 2/2017 | Sprague | G02F 1/167 |
| 10,069,012 | B2 * | 9/2018 | Cho | G11C 19/28 |
| 10,263,202 | B2 * | 4/2019 | Qin | H01L 51/0097 |
| 10,338,421 | B2 * | 7/2019 | Wang | G02F 1/1345 |
| 10,359,656 | B2 * | 7/2019 | Wang | H01L 27/1218 |
| 2001/0040645 | A1 * | 11/2001 | Yamazaki | G02F 1/133305 349/42 |

(Continued)

*Primary Examiner* — Laura M Menz
(74) *Attorney, Agent, or Firm* — Leong C. Lei

(57) ABSTRACT

The invention provides a structure of GOA circuit, which is manufactured on both sides of the ultra-thin flexible substrate with holes, wherein the wires pass through the holes to connect the TFTs in the GOA circuit on the front side to the TFTs in the GOA circuit on the back side to reduce the area occupied by GOA circuit. As such, the circuit area utilization is improved so that the same size of substrate area can carry almost twice the circuit structure to reduce the border width of the non-active area to achieve borderless or ultra-narrow border display panel with high resolution.

8 Claims, 3 Drawing Sheets

(56) References Cited

U.S. PATENT DOCUMENTS

| | | | |
|---|---|---|---|
| 2008/0090338 A1* | 4/2008 | Tredwell | H01L 29/78603 438/151 |
| 2008/0272375 A1* | 11/2008 | Oh | G02F 21/13471 257/72 |
| 2015/0108480 A1* | 4/2015 | Xu | H01L 22/22 257/59 |
| 2015/0295015 A1* | 10/2015 | Yu | H01L 27/3251 257/88 |
| 2016/0372705 A1* | 12/2016 | Hack | H01L 51/5253 |
| 2018/0090702 A1* | 3/2018 | Um | H01L 51/56 |
| 2018/0114905 A1* | 4/2018 | Yu | H01L 51/003 |
| 2018/0210265 A1* | 7/2018 | Wang | H01L 27/1218 |
| 2018/0211609 A1* | 7/2018 | Wang | G02F 1/1345 |
| 2018/0213648 A1* | 7/2018 | Wang | G09F 9/301 |
| 2019/0044079 A1* | 2/2019 | Qin | H01L 51/0097 |

* cited by examiner

STRUCTURE OF GOA CIRCUIT

CROSS REFERENCE TO RELATED APPLICATIONS

This is a divisional application of co-pending U.S. patent application Ser. No. 15/503,707, filed on Feb. 13, 2017, which is a national stage of PCT Application No. PCT/CN2016/112257, filed on Dec. 27, 2016, claiming foreign priority of Chinese Patent Application No. 201611184559.X, filed on Dec. 20, 2016.

BACKGROUND OF THE INVENTION

1. Field of the Invention

The present invention relates to the field of display techniques, and in particular to a structure of gate on array (GOA) circuit.

2. The Related Arts

The liquid crystal display (LCD) provides many advantages, such as thinness, low power-consumption and no radiation, and is widely used in, such as, LCD televisions, mobile phones, personal digital assistants (PDAs), digital cameras, computer screens, laptop screens, and so on. The LCD also dominates the field of panel displays.

Most of the LCDs on the current market are of backlight type, which comprises an LCD panel and a backlight module. The operation theory behind LCD is to inject the liquid crystal (LC) molecules between a thin film transistor (TFT) array substrate and a color filter (CF) substrate, and applies a driving voltage between the two substrates to control the rotation direction of the LC molecules to refract the light from the backlight module to generate the display on the screen.

The active matrix liquid crystal display (AMLCD) is the most commonly used liquid crystal display, which comprises a plurality of pixels, each pixel is controlled by a TFT, the gate of the TFT is connected to a scan line in a horizontal direction, the drain is connected to a data line in a vertical direction, and the source is connected to a corresponding pixel electrode. When a sufficient positive voltage is applied to a scan line in the horizontal direction, all of the TFTs connected to the scan line are turned on, the data signal voltage loaded on the data line is written into the pixel electrode to control the transmittance of different liquid crystals to achieve the effect of color control.

The driving of the horizontal scan line (i.e., gate driving) of the AMLCD horizontal is initially executed by an external integrated circuit (IC). The external IC can control the charge and discharge of the horizontal scan line in each stage progressively. The gate driver on array (GOA) technology, i.e., the array substrate column driving technology, can use the array process of the LCD panel to manufacture the driver circuit of the horizontal scan lines on the substrate at area surrounding the active area to replace the external IC for driving the horizontal scan lines. The GOA technology can reduce the bonding process for external IC and has the opportunity to enhance yield rate and reduce production cost, as well as make the LCD panel more suitable for the production of narrow border display products.

As the display technology progresses, the resolution of the display is also higher and higher. For the displays of the same size, the higher the resolution of the display, the high the number of the stages of GOA circuit is required, and more routing area is occupied, which needs wider display panel border, and is not suitable for the realization of ultra-narrow border or borderless display panel. As a result, the GOA circuit lost the advantages in the production of narrow border display product.

SUMMARY OF THE INVENTION

The object of the present invention is to provide a structure of GOA circuit, able to reduce the routing area required by the GOA circuit to reduce the width of non-active area of LCD to achieve ultra-narrow border borderless display.

To achieve the above object, the present invention provides a structure of GOA circuit, which comprises: a flexible substrate, a first thin film transistor (TFT) layer disposed on the front side of the flexible substrate, a second TFT disposed on the back side of the flexible substrate, and a plurality of wires passing through a plurality of holes on the flexible substrate to electrically connected the first TFT layer and the second TFT layer respectively.

According to a preferred embodiment of the present invention, the material of the flexible substrate is polyimide, polyethylene terephthalate, cycloolefin copolymer, or polyether resin.

According to a preferred embodiment of the present invention, the thickness of the flexible substrate is 10-300 µm.

According to a preferred embodiment of the present invention, both the first TFT layer and the second TFT layer comprise at least a TFT, and each TFT comprises a gate disposed on the flexible substrate, a gate insulation layer covering the gate, a semiconductor layer disposed on the gate insulation layer on the gate, and a source and a drain disposed on the gate insulation layer and contacting respectively the two ends of the semiconductor layer.

According to a preferred embodiment of the present invention, the plurality of holes and the plurality of wires are in a one-to-one correspondence, with each hole disposed with a wire.

According to a preferred embodiment of the present invention, each hole is disposed with at least two wires, and each wire in the same hole is separated from the others by an insulation layer.

According to a preferred embodiment of the present invention, the second TFT layer and the wires disposed on the back side of the flexible substrate are covered with a protective layer.

According to a preferred embodiment of the present invention, the material for the protective layer is silicon oxide.

According to a preferred embodiment of the present invention, the plurality of holes is formed by a laser drilling process or a chemical etching process.

According to a preferred embodiment of the present invention, the wires are made of copper or grapheme.

Another embodiment of the present invention provides a structure of GOA circuit, which comprises: a flexible substrate, a first thin film transistor (TFT) layer disposed on the front side of the flexible substrate, a second TFT disposed on the back side of the flexible substrate, and a plurality of wires passing through a plurality of holes on the flexible substrate to electrically connected the first TFT layer and the second TFT layer respectively;

wherein the material of the flexible substrate being polyimide, polyethylene terephthalate, cycloolefin copolymer, or polyether resin;

wherein the thickness of the flexible substrate is 10-300 µm.

Compared to the known techniques, the present invention provides the following advantages. The present invention provides a structure of GOA circuit, which is manufactured on both sides of the ultra-thin flexible substrate with holes, wherein the wires pass through the holes to connect the TFTs in the GOA circuit on the front side to the TFTs in the GOA circuit on the back side to reduce the area occupied by GOA circuit. As such, the circuit area utilization is improved so that the same size of substrate area can carry almost twice the circuit structure to reduce the border width of the non-active area to achieve borderless or ultra-narrow border display panel with high resolution.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technique means and effect of the present invention, the following uses preferred embodiments and drawings for detailed description.

Figure 1:
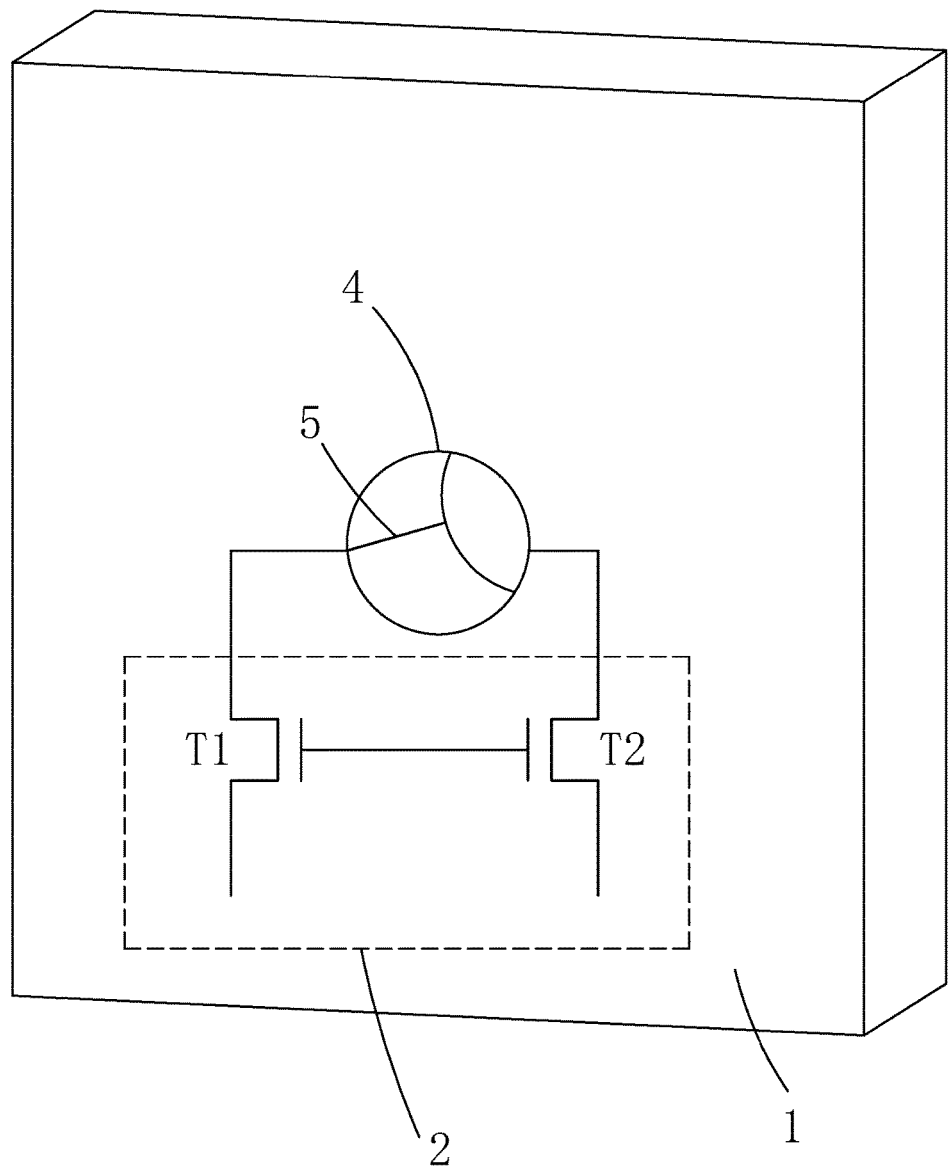
FIG. 1 is a front view showing a structure of GOA circuit provided by the first embodiment of the present invention.
Figure 2:
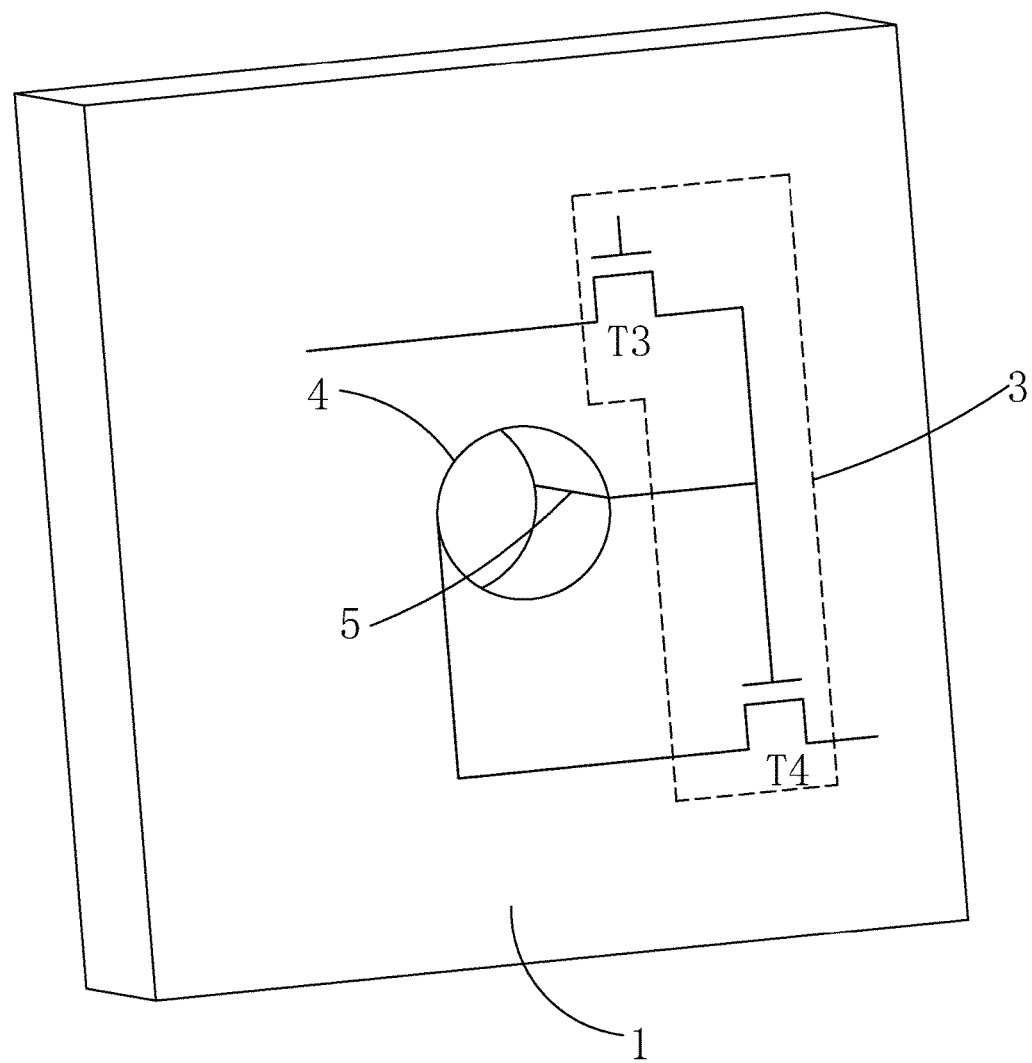
FIG. 2 is a back view showing a structure of GOA circuit provided by the first embodiment of the present invention.
Figure 3:
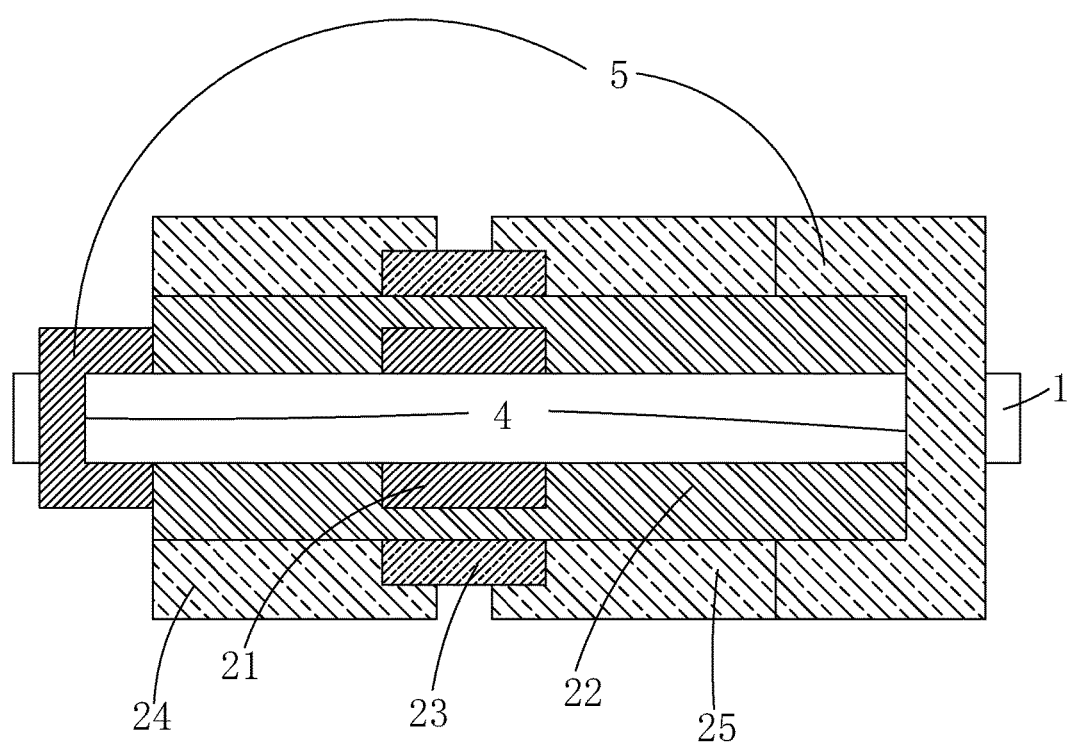
FIG. 3 is a cross-sectional view showing a structure of GOA circuit provided by the second embodiment of the present invention.

Referring to FIGS. 1-3, the present invention provides a structure of GOA circuit, which comprises: a flexible substrate 1, a first thin film transistor (TFT) layer 2 disposed on the front side of the flexible substrate 1, a second TFT 3 disposed on the back side of the flexible substrate 1, and a plurality of wires 5 passing through a plurality of holes 4 on the flexible substrate 1 to electrically connected the first TFT layer 2 and the second TFT layer 3 respectively.

It should be noted that because a plurality of signal inputs is required for TFT connections, the connections between the first TFT layer 2 and the second TFT layer 3 need a plurality of wires 5 for transporting different signals. The wires 5 transporting different signals can be, as shown in FIG. 1 and FIG. 2, a plurality of wires separated by insulation layer in the same hole 4 to transport different signals (i.e., a multi-layer metal structure in the hole 4), or as shown in FIG. 3, each hole corresponds to a wire 5 only, and the wires 5 for different signals are disposed separately (i.e., each hole 4 only comprises a single metal layer structure.)

Specifically, referring to FIG. 1 and FIG. 2, the first embodiment of the present invention adopts the approach that a plurality of wires separated by insulation layer in the same hole 4, which is a typical 4T structure GOA circuit, comprising: a first TFT T1, a second TFT T2, a third TFT T3 and a fourth TFT T4, wherein the first TFT T1 and the second TFT T2 are located at the first TFT layer 2 formed on the front side of the flexible substrate 1, and the third TFT T3 and the fourth TFT T4 are located at the second TFT layer 3 formed on the back side of the flexible substrate 1. The flexible substrate 1 is disposed with a hole 4, and the hole 4 is disposed with two wires 5, with one of the wires 5 passing through the hole 4 to connect the drain of the first TFT t1 to the source of the fourth TFT T4, and the other also passing through the hole 4 to connect the drain of the second TFT T2 to the source of the third TFT T3 and the gate of the fourth TFT T4. The two wires 5 are separated by an insulation layer (not shown).

Specifically, referring to FIG. 3, the second embodiment of the present invention adopts the approach that each hole 4 is disposed with a single wire 5. The second embodiment shows a preferred TFT structure of the present invention, comprising: a gate 21 disposed on the flexible substrate 1, a gate insulation layer 22 covering the gate 21, a semiconductor layer 23 disposed on the gate insulation layer 22 on the gate 21, and a source 24 and a drain 25 disposed on the gate insulation layer 22 and contacting respectively the two ends of the semiconductor layer 23. As shown in FIG. 3, the wire 5 for connecting the gates 21 of the two TFTs on the front side and back side of the flexible substrate 1, and the wire 5 for connecting the drain 25 of the two TFTs on the front side and back side of the flexible substrate 1 are located in different holes 4.

It should be noted that the TFT structure shown in the second embodiment can also be applied to the first embodiment. The present invention can also use other TFT structure, without affecting the realization of the present invention.

Furthermore, the material of the flexible substrate is polyimide, polyethylene terephthalate, cycloolefin copolymer, or polyether resin; and the thickness of the flexible substrate is 10-300 μm. Because the present invention adopts double-sided circuit structure and the holes 4 are formed on the flexible substrate 1 for the wires 5 to pass through to connect circuits on both sides. Therefore, the present invention adopts the flexible substrate 1, which is much thinner than the conventional glass substrate, to ensure the required number of holes 4 to be formed during the flexible substrate manufacturing process, as well as the conductivity of the wires 5. The plurality of holes 4 is formed by a laser drilling process or a chemical etching process; and the wires 5 are made of copper or grapheme, or other metal or semiconductors with good conductivity.

In addition, to protect the circuit on the back side of the flexible substrate 1, the second TFT layer 3 and the wires 5 disposed on the back side of the flexible substrate 1 are covered with a protective layer, wherein the material for the protective layer is silicon oxide (SiOx), or other oxide.

In summary, the present invention provides a structure of GOA circuit, which is manufactured on both sides of the ultra-thin flexible substrate with holes, wherein the wires pass through the holes to connect the TFTs in the GOA circuit on the front side to the TFTs in the GOA circuit on the back side to reduce the area occupied by GOA circuit. As such, the circuit area utilization is improved so that the same size of substrate area can carry almost twice the circuit structure to reduce the border width of the non-active area to achieve borderless or ultra-narrow border display panel with high resolution.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A structure of GOA (gate driver on array) circuit, which comprises: a flexible substrate, a first thin film transistor (TFT) layer disposed on the front side of the flexible substrate, a second TFT layer disposed on the back side of the flexible substrate, and a plurality of wires passing through a plurality of holes on the flexible substrate to electrically connected the first TFT layer and the second TFT layer respectively;

wherein the material of the flexible substrate being polyimide, polyethylene terephthalate, cycloolefin copolymer, or polyether resin;

wherein the thickness of the flexible substrate being 10-300 μm.

2. The structure of GOA circuit as claimed in claim 1, wherein both the first TFT layer and the second TFT layer comprise at least a TFT, and each TFT comprises a gate disposed on the flexible substrate, a gate insulation layer covering the gate, a semiconductor layer disposed on the gate insulation layer on the gate, and a source and a drain disposed on the gate insulation layer and contacting respectively the two ends of the semiconductor layer.

3. The structure of GOA circuit as claimed in claim 1, wherein the plurality of holes and the plurality of wires are in a one-to-one correspondence, with each hole disposed with a wire.

4. The structure of GOA circuit as claimed in claim 1, wherein each hole is disposed with at least two wires, and each wire in the same hole is separated from the others by an insulation layer.

5. The structure of GOA circuit as claimed in claim 1, wherein the second TFT layer and the wires disposed on the back side of the flexible substrate are covered with a protective layer.

6. The structure of GOA circuit as claimed in claim 5, wherein the material for the protective layer is silicon oxide.

7. The structure of GOA circuit as claimed in claim 1, wherein the plurality of holes is formed by a laser drilling process or a chemical etching process.

8. The structure of GOA circuit as claimed in claim 1, wherein the wires are made of copper or grapheme.

* * * * *